METHOD FOR DOPING SEMICONDUCTOR CRYSTALS WITH PHOSPHORUS
Filed April 22, 1968
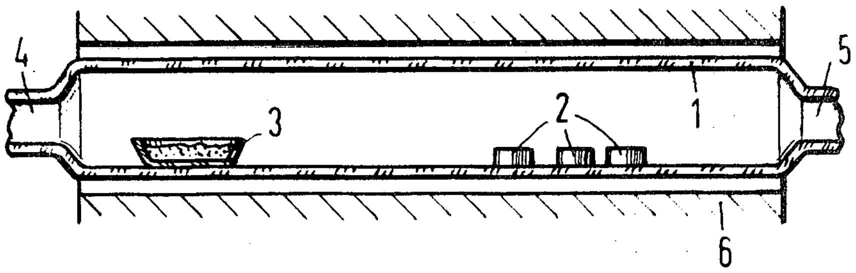

United States Patent Office 3,540,951
Patented Nov. 17, 1970

3,540,951

METHOD FOR DOPING SEMICONDUCTOR CRYSTALS WITH PHOSPHORUS

Erich Pammer and Hans Christ, Munich, Germany, assignors to Siemens Aktiengesellschaft, Berlin and Munich, Germany, a corporation of Germany Filed Apr. 22, 1968, Ser. No. 722,927
Claims priority, application Germany, Apr. 20, 1967, S 109,426
Int. Cl. H01l 7/00, 7/44
U.S. Cl. 148—189 4 Claims

ABSTRACT OF THE DISCLOSURE

The present invention relates to a method for, particularly large-scale, doping of semiconductor crystals with phosphorus, whereby heated semiconductor crystals, to be doped, are subjected to a phosphorus containing atmosphere, which is produced by heating a source, consisting of a phosphorus substance and a carrier substance. In accordance with the present invention, this method is characterized by the use of a source, produced by fusing alkali earth phosphate and phosphorus pentoxide. The present invention further prefers the use of tertiary alkali earth phosphates. Thus, for example, the use of a source produced from tertiary calcium phosphate and phosphorus pentoxide yielded excellent reproducible results for doping semiconductor crystals of silicon or germanium, even when the process was repeated several times.

Our present invention relates to a method for doping semiconductor crystals with phosphorus, particularly in large scale production.

It is customary to subject heated semiconductor crystals, comprised, for example, of germanium or silicon, to a phosphorus gas, for example a mixture of hydrogen and phosphorus halogenide or a mixture of phosphorus pentoxide and an inert gas or oxygen. It is possible to situate both the source, which in a heated state delivers the phosphorus containing gas, and the semiconductor crystals to be doped, in one sealed reaction vessel, for example an ampoule. The heating of the sealed vessel causes the phosphorus or the phosphorus containing substance to evaporate. Phosphorus is then absorbed from the vapor, by the heated semiconductor crystals, and enters the interior of the semiconductor crystals in an atomic state via known diffusion methods.

On the other hand, it is possible to work with a flowing dopant gas. Such gas may be admixed to an inert gas and the thus produced gas mixture may be passed across the heated semiconductor crystals. Here, too, we would recommend passing the carrier gas across a source of the dopant substance, whereby the carrier gas is charged with the vapor of the doping substance. If the operations are carried out in a closed system, a simple adjustment of the source temperature makes it possible with such a source to regulate the dopant content in the doping atmosphere. If a flowing carrier gas is used, the adjustment of the source temperature and the flow velocity of the carrier gas produce reproducible conditions as to the composition of the dopant atmosphere.

In the semiconductor art it is customary to mix the active doping substance inside the source with an inert gas. The source is customarily chosen of the same material as the crystals to be doped, and has a high concentration of the substance, to be used for the doping process. During vaporization, only the doping substance converts into a gaseous phase. Another source, used for example during diffusion of phosphorus, may be produced by fusing phosphorus pentoxide with a vitrifying material, for example calcium oxide or magnesium oxide, whereby the calcium oxide or the magnesium oxide apparently acts only as a carrier and diluent for the actually active $P_2O_5$.

To produce such a source, pulverized components, for example CaO and $P_2O_5$ or MgO and $P_2O_5$, are fused together. The following composition, for example, may be used: 90 g. $P_2O_5$ and 10 g. CaO are heated in a heat-resistant crucible to 1100° C. for approximately 6 to 7 hours. Under foaming and strong fuming of $P_2O_5$ one finally obtains about 45 g. of a glass with a varying composition, which contains per one weight share of CaO only 3.5 to 3.8 shares $P_2O_5$. Hence, more than 60% of the $P_2O_5$ used evaporates during the production process. The resulting $P_2O_5$ fumes are disagreeable, especially as they have a corrosive effect upon the apparatus being used. The heavy foaming of the mixture is also disagreeable.

The initial high content of $P_2O_5$ is necessary, however, as otherwise a homogeneous glass cannot be obtained. The use of this type of source is possible, therefore, since its glassy consistency ensures the storing of an adequate amount of $P_2O_5$, a suitable evaporation speed for the desired doping purposes and an appropriate life span for the source.

The present invention has among its objects the avoidance of the aforedescribed disadvantages in the production of a source. It is also an object of the present invention to produce a source substance of a defined composition and with variable and higher $P_2O_5$ contents.

The present invention relates to a method for, particularly large-scale, doping of semiconductor crystals with phosphorus, whereby heated semiconductor crystals, to be doped, are subjected to a phosphorus containing atmosphere, which is produced by heating a source, consisting of a phosphorus substance and a carrier substance. In accordance with the present invention, this method is characterized by the use of a source, produced by fusing alkali earth phosphate and phosphorus pentoxide. The present invention further prefers the use of tertiary alkali earth phosphates. Thus, for example, the use of a source produced from tertiary calcium phosphate and phosphorus pentoxide yielded excellent reproducible results for doping semiconductor crystals of silicon or germanium, even when the process was repeated several times.

$Ca_3(PO_4)_2$ contains 46% ionically bound $P_2O_5$ and can absorb any additional $P_2O_5$ considerably faster than, for example, CaO. When a powder mixture comprising $Ca_3(PO_4)_2$ and $P_2O_5$ is heated, melting occurs even before the $P_2O_5$ has evaporated to a noticeable degree. The yield is virtually quantitative. The calm melting of the mixture makes it possible to use, simultaneously, any given large amount, while this is considered impossible when using a mixture of $P_2O_5$ and CaO or MgO, because of strong foaming associated therewith. Since, in accordance with the present invention, the components may be fused without an evaporation of $P_2O_5$, glasses of the widest possible composition may be melted. Above all, they can be produced with a higher content of $P_2O_5$. This affords the possibility of using said sources at practically the same temperatures which are needed to diffuse the dopant into the semiconductor. As a result, it is possible to eliminate the expensive two-zone furnaces. These processing furnaces have two different temperature zones, of which one receives the source and the other receives the semiconductor crystals to be doped. When a pure substance is used as the source material, it is naturally not possible to select freely the source temperature, to obtain a desirable supply of dopant material in a carrier gas. On the other hand, the combination of the glasses, produced in accordance with the method of the present invention, may be so selected that a desirable supply of $P_2O_5$ will be obtained at a given temperature.

The weight ratio $P_2O_5$:CaO of the glasses thus produced is limited downward due to the fusibility. A glass of a composition $P_2O_5$:CaO=2.7 could still be produced smoothly. With virtually quantitative yield, however, glasses could be produced with 4.5 parts by weight of $P_2O_5$:1 part by weight of CaO, which are already suitable for use in one-zone furnaces. Within a range of 2.5 to 4.5, the exactness amounts to ±0.02 part. Higher $P_2O_5$ contents are also obtainable (tested up to 7.0 parts), but more $P_2O_5$ becomes volatile thereby. Through appropriate weighing, the composition thus obtained may be established to ±0.01 part. With careful work a reproducibility, up to a maximum of ±0.05, may be obtained here too.

The possibility of absorbing phosphorus pentoxide also exists if the calcium phosphate is substituted by another phosphate of the calcium, or a phosphate of another alkali earth metal, for example beryllium, magnesium, strontium or barium. It becomes understandable why the present invention can also be successfully used for fusing phosphorus pentoxide together with one of the other aforementioned phosphates, for the production of a source. Due to the variable basicity of the oxides, the respective partial pressures are quite different, in comparable compositions.

The performance of the method of the present invention will be further described with respect to an embodiment example using the apparatus shown in the single figure.

A quartz tube 1, developed as a flow through vessel, holds within it semiconductor crystals 2 to be doped. These crystals are comprised, for example, of monocrystalline silicon or germanium. Also within quartz 1 is a source prepared in accordance with the present invention, in a boat-like vessel 3, and comprised of phosphorus glass. A gas current which enters the pipe 1 at the inlet 4, passes over the source 3, reaches the monocrystals 2 to be doped and leaves the reaction chamber at exit 5. The required temperature is supplied by a one-zone furnace, by the heating source 6. In this instance, the source, and the semiconductor crystals, are at the same temperature so that the depth of diffusion is determined primarily by the diffusion time. On the other hand, since the rate of evaporation of $P_2O_5$ is determined by the source temperature, the different dopant deposits must be adjusted by an appropriate adjustment of the carrier gas speed or by suitable sources, which are variously composed, in accordance with the present invention. Using a source of $Ca_3(PO_4)_2$ and $P_2O_5$ with a ratio of $P_2O_5$:CaO of 4.5:1, a temperature of 1100° C. was used for 60 min. to obtain uniform diffusion of 3$\mu$ into silicon wafers 0.3 mm. thick and 32 mm. in diameter.

We claim:

1. A method of doping of semiconductor crystals with phosphorus, which comprises subjecting heated semiconductor crystals to be doped, to a phosphorus atmosphere, by heating a source, comprised of a phosphorus substance and a carrier substance, to produce said phosphorus atmosphere, said source being produced by the fusion of earth alkali phosphate and phosphorus pentoxide.

2. The method of claim 1, wherein the source is fused from a tertiary phosphate of the alkali earth metal and phosphorus pentoxide.

3. The method of claim 2, wherein the substances forming the source are mixed together in powder form and are heated in a temperature resistant inert vessel, to form a glass.

4. The method of claim 1, wherein the $P_2O_5$ partial pressure is adjusted for a given temperature, through the selection of the composition of the source.

References Cited

UNITED STATES PATENTS 3,226,612 12/1965 Haenichen ---------- 148—186

L. DEWAYNE RUTLEDGE, Primary Examiner

R. A. LESTER, Assistant Examiner

U.S. Cl. X.R.

117—106, 201; 148—186, 188

PO-1050
(5/69)

UNITED STATES PATENT OFFICE
CERTIFICATE OF CORRECTION

Patent No. 3,540,951 Dated November 17, 1970

Inventor(s) Erich Pammer et al

It is certified that error appears in the above-identified patent and that said Letters Patent are hereby corrected as shown below:

In the heading the German priority number should read as follows:--S 109 426 IVc/12g--.

SIGNED AND
SEALED
MAR 2 1971

(SEAL)
Attest:

Edward M. Fletcher, Jr.
Attesting Officer

WILLIAM E. SCHUYLER,
Commissioner of Pate